(12) United States Patent
Sandhu et al.

(10) Patent No.: US 6,835,654 B2
(45) Date of Patent: Dec. 28, 2004

(54) METHODS OF FORMING AN ELECTRICALLY CONDUCTIVE LINE

(75) Inventors: Gurtej S. Sandhu, Boise, ID (US); Sujit Sharan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/315,429

(22) Filed: Dec. 9, 2002

(65) Prior Publication Data

US 2003/0119241 A1 Jun. 26, 2003

Related U.S. Application Data

(62) Division of application No. 10/061,738, filed on Jan. 31, 2002, which is a division of application No. 09/233,377, filed on Jan. 18, 1999, which is a division of application No. 08/748,997, filed on Nov. 14, 1996, now Pat. No. 5,997,634.

(51) Int. Cl.$^7$ .......................................... H01L 21/4763
(52) U.S. Cl. ...................... 438/649; 438/583; 438/597; 438/642; 438/651; 438/655
(58) Field of Search ................................ 438/597, 642, 438/647, 648, 649, 651, 652, 655, 660, 661, 581, 583, 856, 592

(56) References Cited

U.S. PATENT DOCUMENTS

| | | | |
|---|---|---|---|
| 4,337,476 A | 6/1982 | Fraser et al. | |
| 4,378,628 A | 4/1983 | Levinstein et al. | |
| 4,568,565 A | 2/1986 | Gupta et al. | |

(List continued on next page.)

FOREIGN PATENT DOCUMENTS

JP        8139056        5/1996

OTHER PUBLICATIONS

Ma et al., "Manipulation of the Ti/Si reaction path by introducing an amorphous Ge interlayer", 4$^{th}$ international conference on Solid–state and Integrated circuit technology Proceedings, 1995, pp. 35–37.

Ilderem, V., et al., "Optimized Deposition Parameters for Low Pressure Chemical Vapor Deposited Titanium Silicide", *Massachusetts Institute of Technology*, vol. 135, No. 10, pp. 2590–2596(Feb. 1988).

Nagabushnam, R. V., et al., "Kinetics and Mechanism of the C49 to C54 Titanium Disilicide Phase Transformation Formation In Nitrogen Ambient", 5 pages (Nov. 1995).

Huang et al. The Influence of Ge–Implantation on the Electrical Characteristics of the Ultra–Shallow. . . IEEE Electron Device Letters, vol. 17, No.3, Mar. 1996, pp. 88–90.

(List continued on next page.)

*Primary Examiner*—Chandra Chaudhari
*Assistant Examiner*—Thanhha Pham
(74) *Attorney, Agent, or Firm*—Wells St. John P.S.

(57) ABSTRACT

Methods of forming an electrically conductive line include providing a stress inducing material within or a compressive stress inducing layer operatively adjacent a crystalline material of a first crystalline phase. In addition, such methods include annealing the crystalline material of the first crystalline phase under conditions effective to transform it to a second crystalline phase. Some methods also include providing stress inducing materials into a refractory metal layer. Example compressive stress inducing layers include $SiO_2$ and $Si_3N_4$, while example stress inducing materials include Ge, W and Co. Where the compressive stress inducing material is provided on the same side of a wafer over which the crystalline phase material is provided, it is provided to have a thermal coefficient of expansion which is less than the first phase crystalline material. Example and preferred crystalline phase materials having two phases are refractory metal silicides, such as $TiSi_x$.

13 Claims, 7 Drawing Sheets

U.S. PATENT DOCUMENTS

| | | |
|---|---|---|
| 4,897,368 A | 1/1990 | Kobushi et al. |
| 4,971,655 A | 11/1990 | Stefano et al. |
| 5,240,739 A | 8/1993 | Doan et al. |
| 5,376,405 A | 12/1994 | Doan et al. |
| 5,470,794 A | 11/1995 | Anjum et al. |
| 5,593,924 A | 1/1997 | Apte et al. |
| 5,608,266 A | 3/1997 | Agnello et al. |
| 5,665,646 A | 9/1997 | Kitano |
| 5,739,597 A | 4/1998 | Bailey et al. |
| 5,874,351 A | 2/1999 | Hu et al. |
| 5,997,634 A | 12/1999 | Sandhu et al. |
| 6,054,387 A * | 4/2000 | Fukuda ................... 438/683 |
| 6,090,708 A | 7/2000 | Sandhu et al. |

OTHER PUBLICATIONS

Omar, M. Ali, "Elementary Solid State Physics," © 1975 by addison–Wesley Publishing Company, Inc., pp. 539–542 (6 pages total).

Wolf, et al., "Silicon Processing for the VLSI Era — vol.1–Process Technology, " ©1986 by Lattice Press, pp. 242,261. 262, 303, & 304 (7 pages total).

* cited by examiner

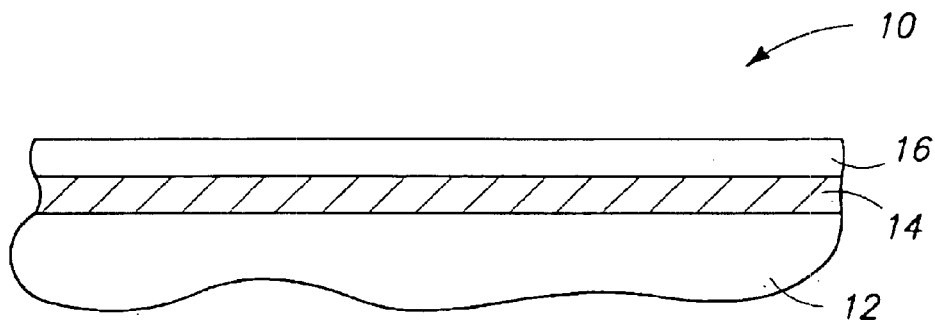
_Fig. 1_
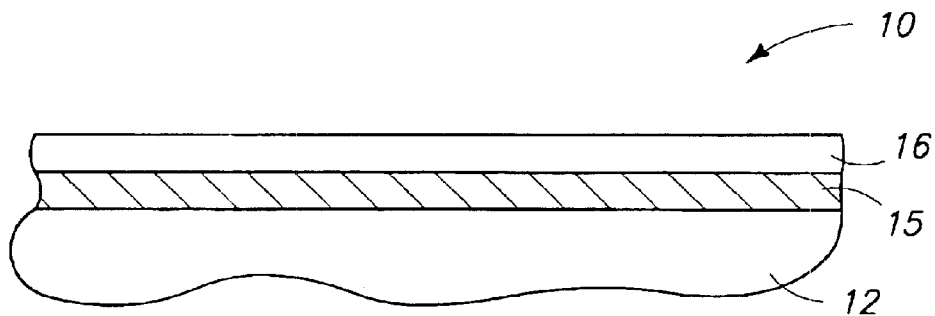
_Fig. 2_
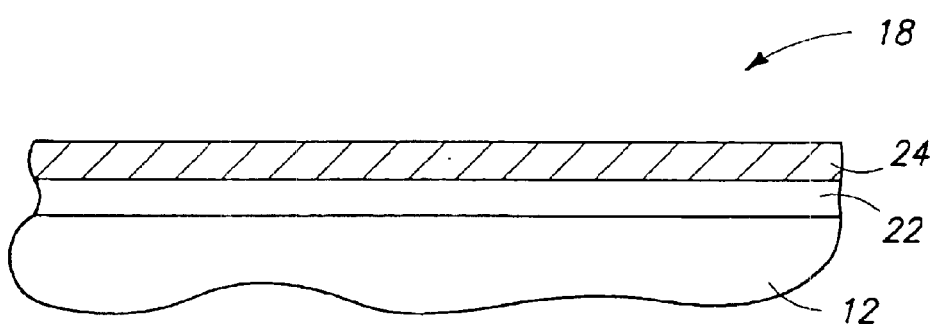
_Fig. 3_

METHODS OF FORMING AN ELECTRICALLY CONDUCTIVE LINE

CROSS REFERENCE TO RELATED APPLICATIONS

This patent resulted from a divisional application of U.S. patent application Ser. No. 10/061,738, filed on Jan. 31, 2002, which is a divisional application of U.S. patent application Ser. No. 09/233,377, filed on Jan. 18, 1999, which is a divisional application of U.S. patent application Ser. No. 08/748,997, filed on Nov. 14, 1996, now U.S. Pat. No. 5,997,634.

TECHNICAL FIELD

This invention relates generally to formation of crystalline phase materials in semiconductor wafer processing and more particularly to formation of refractory metal suicides and crystalline phase transformation thereof.

BACKGROUND OF THE INVENTION

Silicides, such as titanium silicide and tungsten suicide, are commonly utilized electrically conductive materials in semiconductor wafer integrated circuitry fabrication. Such materials are utilized, for example, as capping layers over underlying conductively doped polysilicon material to form electrically conductive lines or interconnects. Such silicide materials are also utilized at contact bases intermediate an underlying silicon substrate and overlying conductive polysilicon contact plugging material. Silicides can be provided by chemical vapor deposition, or by deposition of elemental titanium or tungsten over an underlying silicon surface. Subsequent high temperature annealing causes a chemical reaction of the tungsten or titanium with the underlying silicon to form the silicide compound.

Titanium silicide ($TiSi_2$) occurs in two different crystalline structures or phases referred to as the C49 and C54 phase. The C49 structure is base-centered orthorhombic, while the C54 is face-centered orthorhombic. The C54 phase occurs in the binary-phase diagram while the C49 phase does not. The C49 phase is therefor considered to be metastable. The C54 phase is a densely packed structure having 7% less volume than the C49 phase. The C54 phase also has lower resistivity (higher conductivity) than the C49 phase.

The C49 phase forms at lower temperatures during a typical refractory metal silicide formation anneal (i.e. at from 500° C.–600° C.) and transforms to the C54 phase at higher elevated temperatures (i.e., greater than or equal to about 650° C.). The formation of the higher resistive C49 phase has been observed to be almost inevitable due to the lower activation energies associated with it (2.1–2.4 eV) which arises from the lower surface energy of the C49 phase compared to that of the more thermodynamically stable C54 phase. Hence, the desired C54 phase can be obtained by transforming the C49 phase at elevated temperatures.

Due at least in part to its greater conductivity, the C54 phase is much more desirable as contact or conductive line cladding material. Continued semiconductive wafer fabrication has achieved denser and smaller circuitry making silicide layers thinner and narrower in each subsequent processing generation. As the silicide layers become thinner and narrower, the ratio of surface area to volume of material to be transformed from the C49 to the C54 phase increases. This requires ever increasing activation energies to cause the desired transformation, which translates to higher anneal temperatures to effect the desired phase transformation. In some instances, the temperature must be at least equal to or greater than 800° C. Unfortunately, heating a silicide layer to a higher temperature can result in undesired precipitation and agglomeration of silicon in such layer, and also adversely exposes the wafer being processed to undesired and ever increasing thermal exposure. The processing window for achieving or obtaining low resistance silicide phases for smaller line widths and contacts continues to be reduced, making fabrication difficult.

It would be desirable to develop methods which facilitate the C49 to C54 phase transformation in titanium silicide films. Although the invention was developed with an eye towards overcoming this specific problem, the artisan will appreciate applicability of the invention in other areas, with the invention only being limited by the accompanying claims appropriately interpreted in accordance with the Doctrine of Equivalents.

SUMMARY

In but one aspect, the invention provides a method of forming a crystalline phase material. In one implementation, the method is performed by providing a stress inducing material within or operatively adjacent a crystalline material of a first crystalline phase prior to anneal. The crystalline material of the first crystalline phase is annealed under conditions effective to transform it to a second crystalline phase. The stress inducing material preferably induces compressive stress within the first crystalline phase during the anneal to the second crystalline phase to lower the required activation energy to produce a more dense second crystalline phase.

In accordance another aspect, the invention provides a method of forming a refractory metal suicide. In one implementation, the method is performed by forming a refractory metal silicide of a first crystalline phase. Compressive stress inducing atoms are provided within the refractory metal silicide of the first crystalline phase, with the compressive stress inducing atoms being larger than silicon atoms of the silicide. With the compressive stress inducing atoms within the first phase refractory metal silicide, the refractory metal silicide of the first crystalline phase is annealed under conditions effective to transform said silicide to a more dense second crystalline phase.

In another implementation, a stress inducing material is formed over the opposite side of the wafer over which the first phase crystalline material is formed.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer at a processing step subsequent to that shown by FIG. 1.

FIG. 3 is a diagrammatic sectional view of another alternate semiconductor wafer fragment at an alternate processing step in accordance with the invention.

DETAILED DESCRIPTION OF THE PREFERRED EMBODIMENTS

Figure 4:
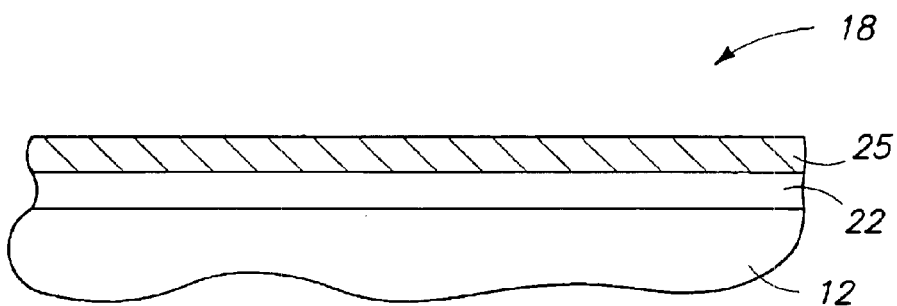
FIG. 4 is a view of the FIG. 3 wafer at a processing step subsequent to that shown by FIG. 3.

This disclosure of the invention is submitted in furtherance of the constitutional purposes of the U.S. Patent Laws "to promote the progress of science and useful arts" (Article 1, Section 8).

Referring initially to FIGS. 1 and 2, a semiconductor wafer fragment in process is indicated generally with reference numeral 10. Such comprises a substrate 12, for example in the form of a bulk monocrystalline silicon wafer, having an overlying crystalline material layer 14 capable of undergoing a phase transformation from a first crystalline phase to a second crystalline phase. Example materials include refractory metal suicides, such as $TiSi_x$ (where "x" ranges from 0.5 to 2.5 and is predominately "2") with a first crystalline phase being C49 and a second crystalline phase being C54. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A layer 16 of compressive stress inducing material is provided over and in contact with (i.e., "on") first crystalline phase material 14. Layer 16 ideally has a thermal coefficient of expansion which is less than the thermal coefficient of expansion of first crystalline phase material layer 14, particularly at a desired temperature of phase transformation. Thus, the stress induced in layer 14 at phase transformation anneal will be of a compressive nature due to the greater expansion properties of layer 14 as compared to those of layer 16. Layer 16 preferably has a thickness which is equal to or greater than a thickness of first phase crystalline material 14 to facilitate inducing desired stress. An example thickness for layers 14 and 16 is from 100 to 2000 Angstroms. Layer 16 is preferably comprised of a material that will not react with the underlying refractory metal silicide. Example and preferred materials for layer 16 include $SiO_2$ (doped or undoped) and $Si_3N_4$.

Referring to FIG. 2, first phase crystalline material layer 14 is annealed under conditions effective to transform it to a second more dense and electrically conductive crystalline phase layer 15, such as C54 $TiS_x$ in the case of C49 titanium silicide of layer 14. The phase transformation of a refractory metal silicide from the C49 phase to the C54 phase occurs with the 7% volume reduction or density increase. Compressive stresses induced by the lesser expanding layer 16 during anneal help to facilitate phase transformation from C49 to C54 by the compressive forces facilitating this volume reduction, and reduces the required activation energy for achieving the phase transformation, which is typically in the prior art provided by temperature anneal alone. For example, one prior art processing window for achieving the desired phase transformation is at a temperature of 800° C. for a tightly controlled period of time of from 15–20 seconds for a 350 Angstrom thick C49 $TiSi_x$ film. Utilizing a compressive stress inducing layer 16 enables transformation to occur at temperatures less than or equal to about 750° C. in an inert atmosphere (i.e., nitrogen or argon) and with less stringent time requirements, and thus potentially enables less thermal processing of the substrate being treated. An example pressure during the anneal would be from 1 Torr to 760 Torr.

The above first described preferred embodiment is but one example of a method of providing a stress inducing material (i.e., layer 16) operatively adjacent a crystalline material of a first crystalline phase (i.e. layer 14) to be effective to induce stress (i.e. in this example compressive stress) as the material is annealed to a second crystalline phase. An alternate example of providing a stress inducing material operatively adjacent a crystalline material to be transformed to a secondary crystalline phase is to provide such stress inducing material under or inwardly of the first crystalline phase material, as described with reference to FIGS. 3–4. Such illustrates a semiconductor wafer fragment in process generally with reference numeral 18. In FIG. 3, such comprises a substrate 20, for example bulk monocrystalline silicon or layers of material, having an overlying stress inducing material layer 22. A layer 24 of crystalline material of the first crystalline phase is provided outwardly of layer 22, with layer 22 thus being inwardly of or under layer 24 and in the illustrated example in contact therewith. In the example refractory metal silicide transformation of a C49 phase to a C54 phase accompanied by a volume reduction, layer 22 ideally also has a coefficient of expansion which is less than the coefficient of expansion of layer 24. Such facilitates putting layer 24 in compressive stress during phase transformation. Example materials include those provided above for layer 16.

Referring to FIG. 4, annealing is conducted as in the first described embodiment to transform first crystalline phase material layer 24 into a more dense and higher electrically conductive second phase material layer 25.

Figure 5:
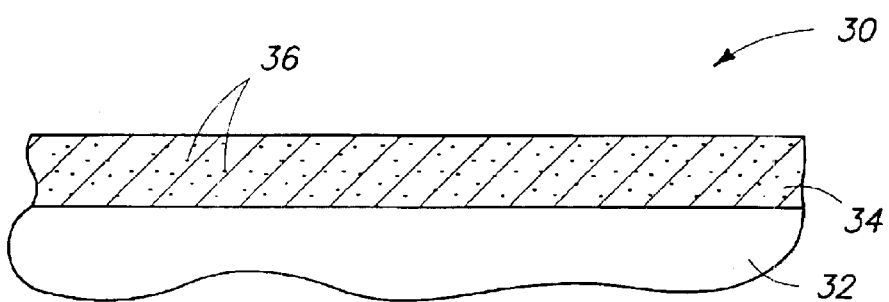
FIG. 5 is a diagrammatic sectional view of yet another alternate semiconductor wafer fragment at another alternate processing step in accordance with the invention.

Yet another alternate example is described with reference to FIGS. 5 and 6. Here, the stress inducing material is provided within the crystalline material undergoing phase transformation. FIG. 5 illustrates a wafer fragment 30 comprised of some substrate construction 32. Again, such could be a monocrystalline silicon substrate or some other substrate assembly atop monocrystalline silicon or some other material. A crystalline material of a first crystalline phase 34, such as a refractory metal silicide, is formed outwardly of substrate 32. An example technique, as with the above described embodiment, is by chemical vapor deposition. Alternate examples of providing first phase crystalline materials for layers 14, 24 and 34 of the first described embodiments will be described below. Compressive stress inducing atoms 36 are provided within first crystalline phase material layer 34. Where layer 34 comprises a refractory metal silicide, atoms 36 advantageously are provided to be larger than silicon atoms of the silicide to produce desired compressive stress during the anneal to produce the volume reduced phase transformation. Such example atoms include Ge, W and Co or mixtures thereof. One example technique for providing atoms 36 within layer 34 is by ion implantation or gas diffusion. An example concentration range is from $10^{16}$–$10^{22}$ atoms/cm$^3$.

Figure 6:
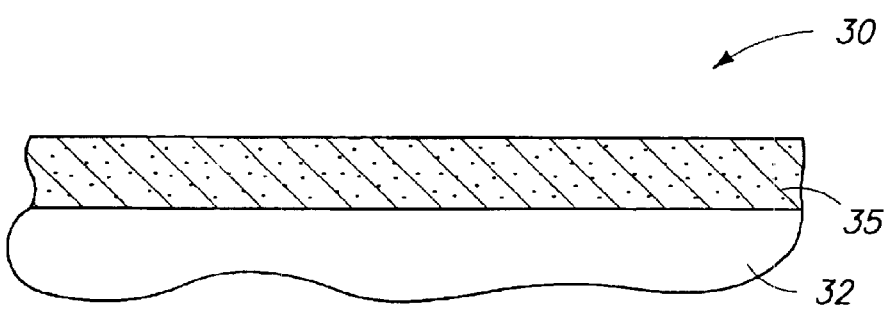
FIG. 6 is a view of the FIG. 5 wafer at a processing step subsequent to that shown by FIG. 5.

Referring to FIG. 6, the refractory metal silicide of the first crystalline phase is annealed under conditions effective to transform silicide to a more dense second crystalline phase layer 35, with atoms 36 inducing compressive stress during such anneal. Anneal conditions as described above are preferred.

Thus, the above described embodiments provide alternate examples of providing stress inducing material proximate (either within or operatively adjacent) a crystalline material of a first crystalline phase which is to undergo phase transformation to a second crystalline phase. In the described and preferred embodiment, such is accompanied by a volume reduction such that the stress induced is desirably of a compressive nature. The above two techniques could of course also be combined such that the stress inducing material is provided both within and operatively adjacent the material undergoing phase transformation. Further, the stress inducing material layer might be provided prior to the subject layer being transformed being at the first crystalline phase conditions. For example, refractory metals when deposited over silicon containing layers, such as polysilicon, undergo chemical transformation to silicides merely under elevated temperature anneal conditions In each of the above described embodiments, the stress inducing material was provided after the suicide material of the first crystalline phase came into existence. An alternate example whereby the stress inducing material is provided before the first phase crystalline material comes into existence is initially described with reference to FIGS. 7–9.

Figure 7:
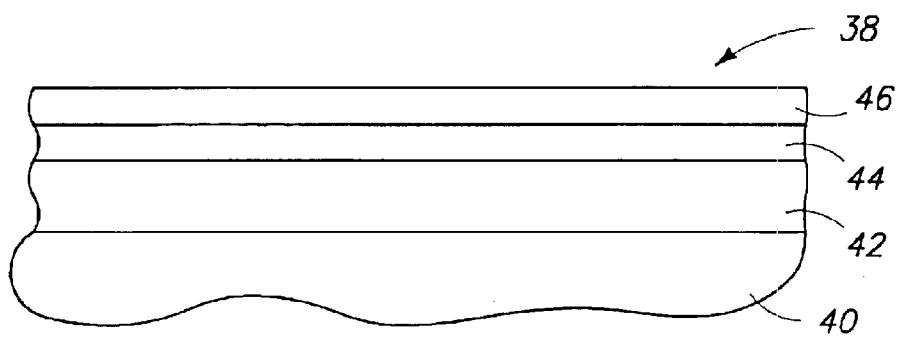
FIG. 7 is a diagrammatic sectional view of still another alternate semiconductor wafer fragment at another alternate processing step in accordance with the invention.

FIG. 7 illustrates a wafer fragment 38 comprised of a substrate in the illustrated form of a silicon, SiO$_2$ or other material substrate 40 having an overlying stress inducing material layer 42, such as SiO$_2$ or Si$_3$N$_4$. An example thickness for layer 42 is from 100–2000 Angstroms. A polysilicon layer 44 of an example thickness of from 100–2000 Angstroms is provided outwardly of stress inducing material layer 44. Outwardly thereof is provided a refractory metal layer 46, such as elemental titanium. Thus, a refractory metal (i.e., layer 46) is formed on a silicon containing substrate (i.e. layer 44). The thickness of layer 42 is preferably greater than or equal to the combined thickness of layers 44 and 46.

Figure 8:
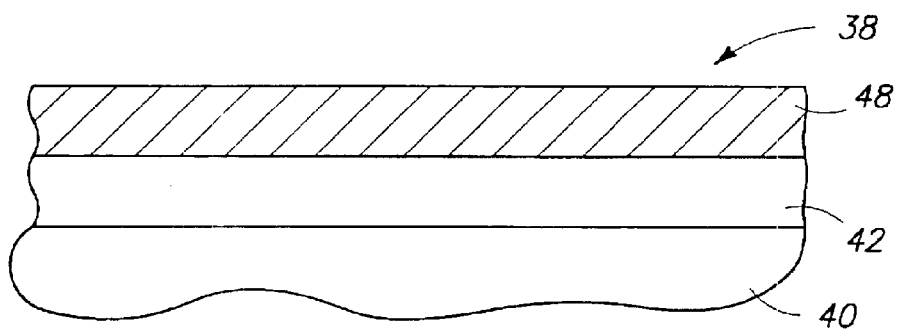
FIG. 8 is a view of the FIG. 7 wafer at a processing step subsequent to that shown by FIG. 7.

Referring to FIG. 8, wafer 38 is annealed to impart a reaction to form a refractory metal silicide layer 48 of, for example, the first C49 crystalline phase from the refractory metal of layer 46 and the silicon of the underlying substrate 44. Example anneal conditions include 600° C., 760 Torr in an inert N$_2$ or Ar ambient for 20 seconds.

Figure 9:
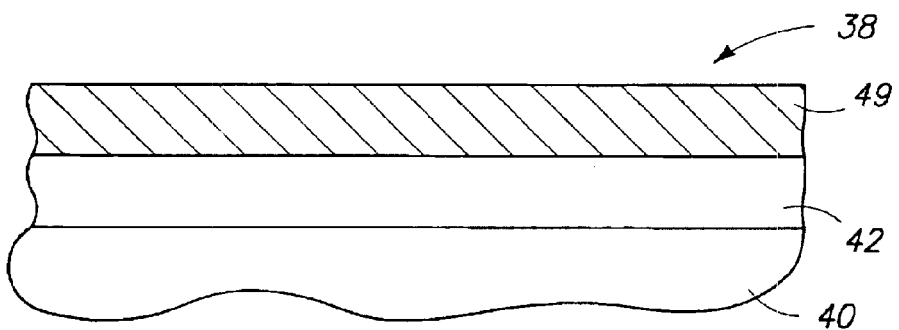
FIG. 9 is a view of the FIG. 7 wafer at a processing step subsequent to that shown by FIG. 8.

Referring to FIG. 9, refractory metal silicide layer 48 of the first crystalline phase is annealed to transform the first phase silicide to a more dense second crystalline phase layer 49. Example anneal conditions for such phase transformation are as described above with respect to the first described embodiments. Alternately, the wafer fragment of FIG. 7 could inherently be subjected to the second phase transformation anneal conditions at the outset, wherein the wafer being processed would inherently be transformed initially to the FIG. 8 embodiment and subsequently to the FIG. 9 embodiment.

The above described embodiment with respect to FIGS. 7–9 could of course also be utilized in conjunction with the FIGS. 5 and 6 embodiment wherein the stress inducing material is provided within the first crystalline phase material. For example, the compressive stress inducing atoms can be provided in situ into a refractory metal layer during its deposition over an underlying silicon containing substrate. Such could be provided for example by sputtering or chemical vapor deposition such that the atoms are received within the deposited refractory metal layer. Alternately, ion implanting or gas diffusion doping could be utilized. An example concentration range for the stress inducing atoms is as described above, namely from $10^{16}$–$10^{22}$ atoms/cm$^3$. Subsequently, the refractory metal layer having the atoms therein would be annealed to form the refractory metal silicide of the first crystalline phase from the reaction of the refractory metal and underlying silicon. Continued or subsequent annealing with the stress inducing atoms in place will facilitate phase transformation to the second phase.

Figure 10:
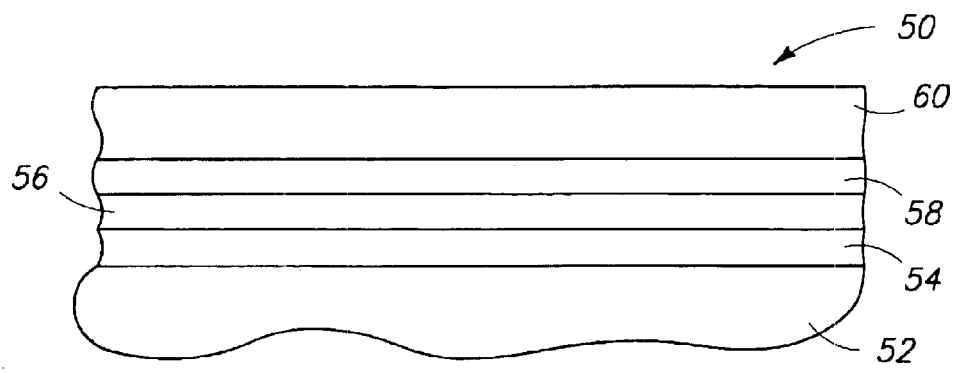
FIG. 10 is a diagrammatic sectional view of another alternate semiconductor wafer fragment at another alternate processing step in accordance with the invention.

Another alternate embodiment is described with reference to FIGS. 10–12 whereby the stress inducing layer is provided over or outwardly of, and thereby operatively adjacent, the titanium layer prior to its initial transformation to the first C49 crystalline phase. FIG. 10 illustrates a semiconductor wafer fragment 50 comprised of a bulk monocrystalline silicon substrate and an overlying insulating layer 54, such as SiO$_2$. A polysilicon layer 56 is provided outwardly of layer 54, with a refractory metal layer 58, such as titanium, provided outwardly of polysilicon layer 56. A compressive stress inducing layer 60 is provided over and on titanium layer 58 and preferably has a thickness equal to or greater than the combined thickness of layers 56 and 58.

Figure 11:
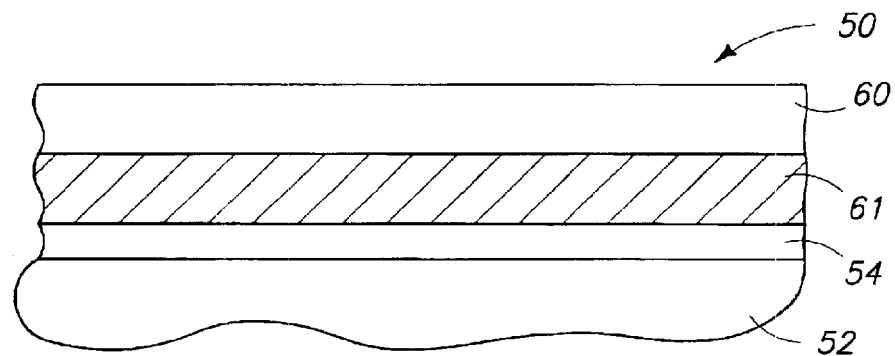
FIG. 11 is a view of the FIG. 10 wafer at a processing step subsequent to that shown by FIG. 10.

Referring to FIG. 11, suitable annealing conditions for example as described above are utilized to transform layers 56 and 58 into a C49 first crystalline phase layer 61.

Figure 12:
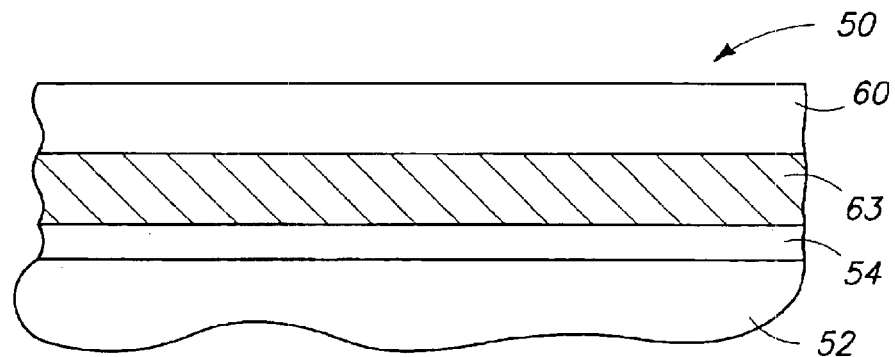
FIG. 12 is a view of the FIG. 10 wafer at a processing step subsequent to that shown by FIG. 11.

Referring to FIG. 12, subsequent or continued suitable annealing transforms first crystalline phase material layer 61 into second C54 crystalline phase material layer 63, with the presence of compressive stress inducing layer 60 facilitating such phase transformation as described above.

The above described embodiments can be utilized in contact or any other technologies where refractory metal silicides or other crystalline materials are formed. An example embodiment in utilizing aspects of the above process in fabricating of electrically conductive lines is described with reference to FIGS. 13–16.

Figure 13:
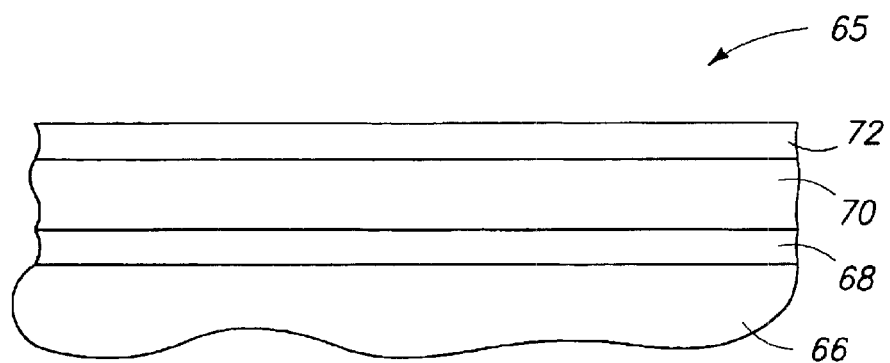
FIG. 13 is a diagrammatic sectional view of another alternate semiconductor wafer fragment at another alternate processing step in accordance with the invention.

Referring to FIG. 13, a wafer fragment 65 comprises a bulk monocrystalline silicon substrate 66 having a gate oxide layer 68 provided thereover. A layer of polysilicon 70 is provided outwardly of gate oxide layer 68 with a silicide layer 72 of a C49 first crystalline phase provided outwardly of polysilicon layer 70. Such can be provided by the above or other conventional techniques. Thus, a semiconductive material (i.e. silicon of layer 70) is provided over a substrate, (i.e. material 68 and 66), with a refractory metal silicide 72 of a first crystalline phase being provided over and in ohmic electrical connection with the semiconductive materials. Layer 70 is desirably conductively doped with a suitable conductively enhancing impurity either at this point or subsequent in the processing.

Figure 14:
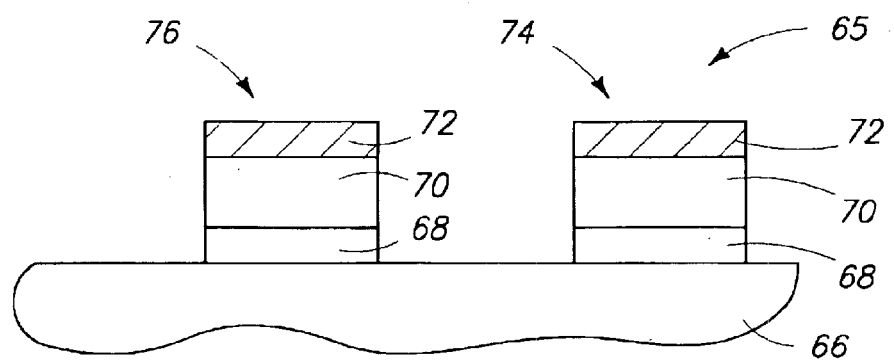
FIG. 14 is a view of the FIG. 13 wafer at a processing step subsequent to that shown by FIG. 13.

Referring to FIG. 14, layers 72, 70 and 68 are patterned into conductive lines 74 and 76.

Figure 15:
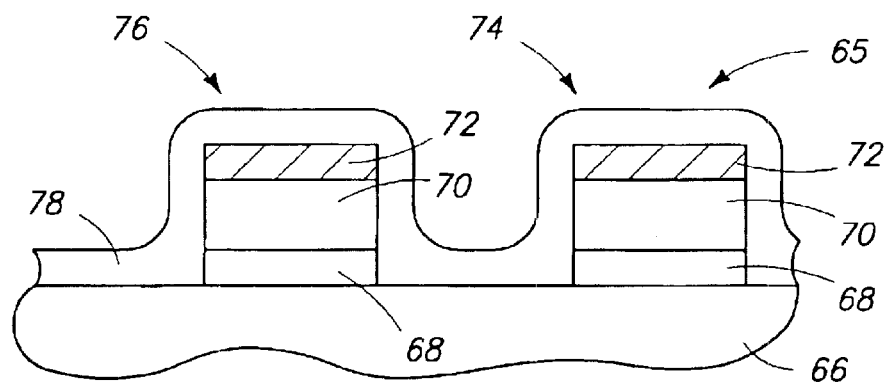
FIG. 15 is a view of the FIG. 13 wafer at a processing step subsequent to that shown by FIG. 14.

Referring to FIG. 15, a compressive stress inducing material layer 78 is formed outwardly of lines 74 and 76, preferably to a thickness at least as great as silicide portion 72. Again, preferred materials include $SiO_2$ or $Si_3N_4$.

Figure 16:
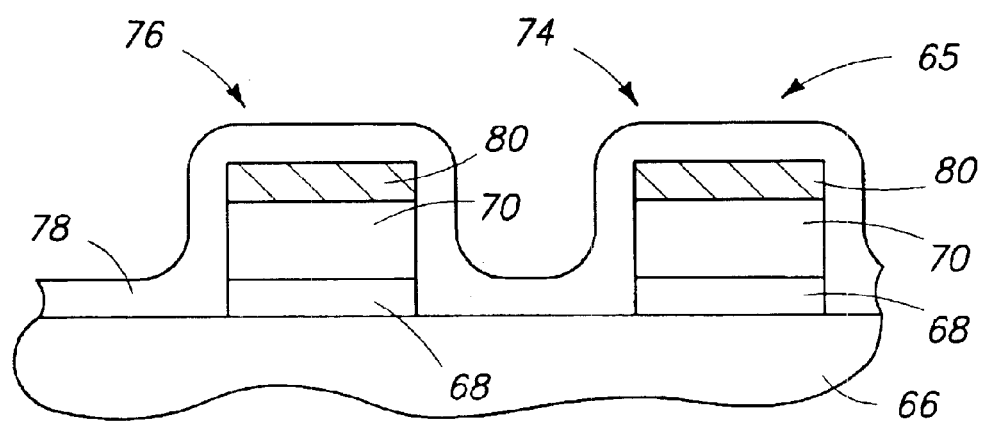
FIG. 16 is a view of the FIG. 13 wafer at a processing step subsequent to that shown by FIG. 15.

Referring to FIG. 16, the wafer fragment is annealed as above to transform the silicide material 72 of the first crystalline phase to C54 second crystalline phase material 80. Layer 78 can remain, be removed, anisotropically etched or otherwise processed as the circuitry design dictates.

The above described FIGS. 13–16 embodiment is a technique whereby the conductive line patterning (in this example a gate line) is conducted before the annealing, and the compressive stress inducing material is provided after the line patterning. Alternately, the patterning can be conducted after the annealing. Further, compressive stress inducing material can be provided within the first crystalline phase refractory metal silicide layer 72 as is for example described with reference to the FIGS. 5 and 6 embodiment. Alternate techniques are also of course contemplated, as will be appreciated by the artisan.

Figure 17:
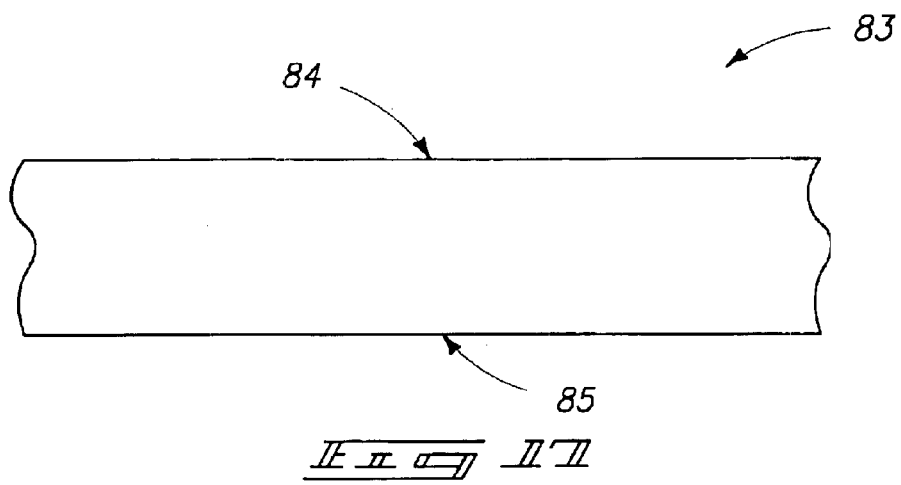
FIG. 17 is a diagrammatic sectional view of still another alternate semiconductor wafer fragment at another alternate processing step in accordance with the invention.

A further alternate embodiment is described with reference to FIGS. 17–19. FIG. 17 illustrates a semiconductor wafer fragment 83 (such as monocrystalline silicon) having opposing first and second sides 84 and 85, respectively.

Figure 18:
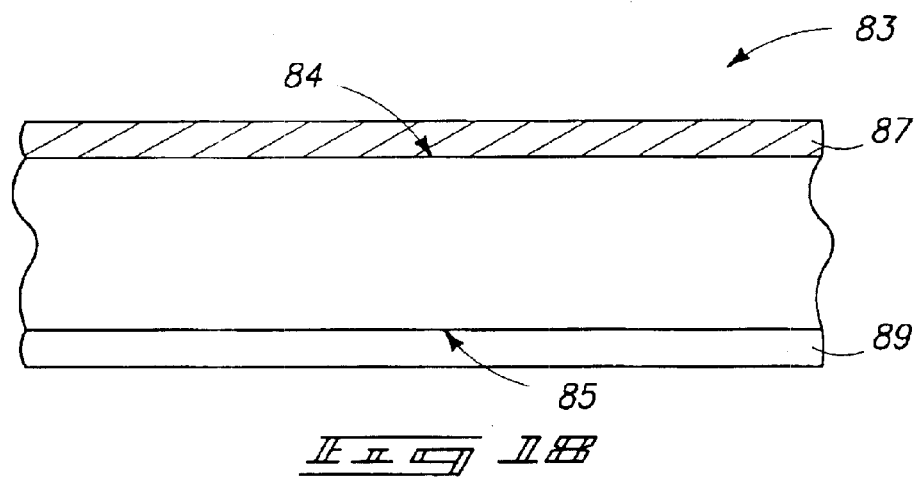
FIG. 18 is a view of the FIG. 17 wafer at a processing step subsequent to that shown by FIG. 17.

Referring to FIG. 18, a crystalline material layer 87 of a first crystalline phase (such as the exemplary C49 $TiSi_x$) is formed over first wafer side 84. A compressive stress inducing material layer 89 is provided over and on second wafer side 85. Layer 89 is provided to have a thermal coefficient of expansion which exceeds that of layer 87. An example material where layer 87 comprises a refractory metal silicide is TiN.

Figure 19:
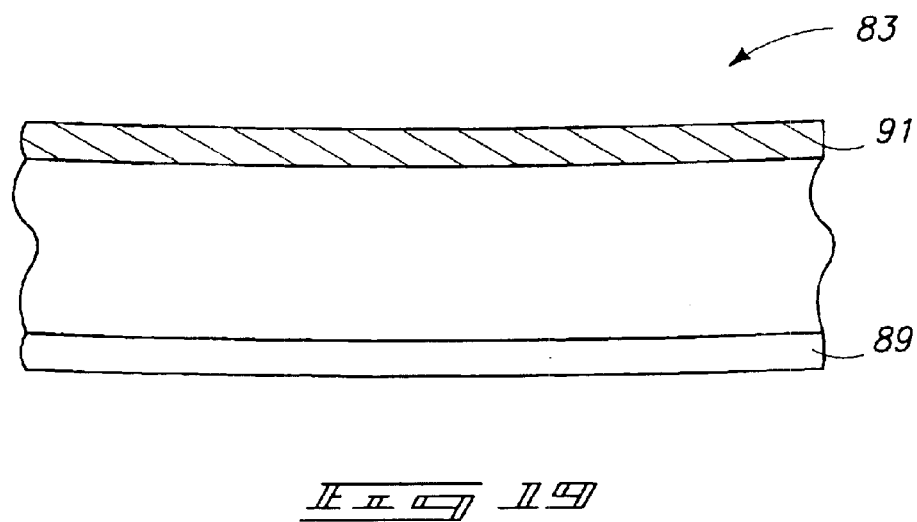
FIG. 19 is a view of the FIG. 17 wafer at a processing step subsequent to that shown by FIG. 18.

Referring to FIG. 19, wafer 83 is annealed under conditions such as that described above to transform first phase material 87 into second phase material 91. The greater coefficient of layer 89 as compared to layer 87 causes a degree of bowing which effectively places layer 87 in compressive stress to facilitate its transformation to layer 91.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrically conductive line comprising:

forming a refractory metal silicide on and in ohmic electrical connection with semiconductive material comprising polycrystalline silicon, the refractory metal silicide having a first crystalline phase;

providing a layer of compressive stress inducing material operatively coupled with the refractory metal silicide, the layer of compressive stress inducing material being configured to permit a phase change of the first crystalline phase to a second crystalline phase at a temperature of less than or equal to 750° C.;

after providing the layer of compressive stress inducing material, annealing the refractory metal silicide at a temperature of less than or equal to 750° C. to transform the first crystalline phase to the second crystalline phase, the second crystalline phase being more dense and more electrically conductive than the first crystalline phase; and patterning the semiconductive material and the refractory metal silicide into a conductive line.

2. The method of claim 1 further comprising providing compressive stress inducing atoms disposed within the refractory metal silicide, the atoms being larger than silicon atoms.

3. The method of claim 2 wherein the compressive stress inducing atoms comprise germanium atoms.

4. The method of claim 3 wherein the germanium atoms are disposed within the refractory metal silicide by ion implantation.

5. The method of claim 1 wherein the layer of compressive stress inducing material is provided over and operatively adjacent the refractory metal silicide of the first crystalline phase.

6. The method of claim 1 wherein the patterning is conducted before the annealing.

7. The method of claim 1 wherein the patterning is conducted before the annealing, and the layer of compressive stress inducing material is provided after the patterning.

8. The method of claim 1 wherein the patterning is conducted after the annealing.

9. The method of claim 1 wherein the refractory metal silicide comprises $TiSi_x$, and the first crystalline phase is C49 and the second crystalline phase is C54.

10. The method of claim 1 comprising providing the layer of compressive stress inducing material on the refractory metal silicide.

11. The method of claim 1 comprising providing the layer of compressive stress inducing material under the refractory metal silicide.

12. The method of claim 1 wherein the compressive stress inducing material comprises $SiO_2$.

13. The method of claim 1 wherein the compressive stress inducing material comprises $Si_3N_4$.

* * * * *

UNITED STATES PATENT AND TRADEMARK OFFICE
CERTIFICATE OF CORRECTION

PATENT NO. : 6,835,654 B2
DATED : December 28, 2004
INVENTOR(S) : Sandhu et al.

It is certified that error appears in the above-identified patent and that said Letters Patent is hereby corrected as shown below:

Title page,
Item [56], References Cited, U.S. PATENT DOCUMENTS, insert
-- 5,828,131   10/1998        Cabral, Jr. et al.
    6,376,372   04/2002        Paranjpe et al. --.

Column 1,
Line 18, replace "suicides" with -- silicides --.
Line 23, replace "suicide" with -- silicide --.

Column 2,
Line 34, after "accordance" insert -- with --.
Line 35, replace "suicide" with -- silicide --.

Column 3,
Line 50, replace "suicides" with -- silicides --.

Column 4,
Line 16, replace "TiS$_x$" with -- TiSi$_x$ --.

Column 5,
Line 45, after "conditions" insert -- . --.
Line 47, replace "suicide" with -- silicide --.

Column 8,
Line 2, replace Claim 1 with the following:
-- 1.   A method of forming an electrically conductive line comprising: forming a gate oxide layer over a substrate;

forming a semiconductive material comprising polycrystalline silicon over the gate oxide;

forming a refractory metal silicide on and in ohmic electrical connection with the semiconductive material, the refractory metal silicide having a first crystalline phase as initially formed;

providing a layer of compressive stress inducing material operatively coupled with the refractory metal silicide, the layer of compressive stress inducing material having a thickness exceeding a thickness of the refractory metal silicide and being configured to permit a phase change of the first crystalline phase to a second crystalline phase at a temperature of less than or equal to 750°C;

UNITED STATES PATENT AND TRADEMARK OFFICE
CERTIFICATE OF CORRECTION

PATENT NO.    : 6,835,654 B2
DATED         : December 28, 2004
INVENTOR(S)   : Sandhu et al.

It is certified that error appears in the above-identified patent and that said Letters Patent is hereby corrected as shown below:

Column 8 (cont'd),
 after providing the compressive stress inducing layer of material, annealing the refractory metal silicide at a temperature of less than or equal to 750°C to transform the first crystalline phase to the second crystalline phase, the second crystalline phase being more dense and more electrically conductive than the first crystalline phase; and patterning the gate oxide, the semiconductive material and the refractory metal silicide into a conductive line. --.

Signed and Sealed this

Twenty-second Day of November, 2005

JON W. DUDAS
*Director of the United States Patent and Trademark Office*